US007692512B2

(12) United States Patent
Podell

(10) Patent No.: US 7,692,512 B2

(45) Date of Patent: Apr. 6, 2010

(54) BALUN WITH SERIES-CONNECTED BALANCED-SIGNAL LINES

(75) Inventor: Allen F. Podell, Palo Alto, CA (US)

(73) Assignee: Werlatone, Inc., Brewster, NY (US)

( * ) Notice: Subject to any disclaimer, the term of this patent is extended or adjusted under 35 U.S.C. 154(b) by 94 days.

(21) Appl. No.: 12/055,139

(22) Filed: Mar. 25, 2008

(65) Prior Publication Data

US 2009/0243750 A1 Oct. 1, 2009

(51) Int. Cl.
*H03H 7/42* (2006.01)
*H03H 7/38* (2006.01)

(52) U.S. Cl. .......................................... 333/26; 333/33

(58) Field of Classification Search .................. 333/25, 333/26, 33, 238

See application file for complete search history.

(56) References Cited

U.S. PATENT DOCUMENTS

| | | | | |
|---|---|---|---|---|
| 3,103,638 | A * | 9/1963 | Greuet | 333/127 |
| 3,827,001 | A * | 7/1974 | Laughlin | 333/127 |
| 4,288,762 | A * | 9/1981 | Laughlin | 333/117 |
| 4,719,699 | A * | 1/1988 | Dash et al. | 30/90.1 |
| 4,825,220 | A | 4/1989 | Edward et al. | |
| 5,121,090 | A * | 6/1992 | Garuts et al. | 333/124 |
| 5,977,842 | A * | 11/1999 | Brown et al. | 333/26 |
| 5,982,252 | A | 11/1999 | Werlau | |
| 6,130,588 | A * | 10/2000 | Gallivan et al. | 333/25 |
| 6,285,273 | B1 | 9/2001 | Morikawa | |
| 6,750,752 | B2 | 6/2004 | Werlau | |
| 7,190,240 | B2 | 3/2007 | Podell | |

OTHER PUBLICATIONS

The Southgate Amateur Radio Club web page "Techtips Coax Balun," http://www.southgatearc.org/techtips/coax_balun.htm, byline given as "G8MNY," downloaded Aug. 3, 2007.

Microwaves101.com Microwave Encyclopedia web page, "Baluns," http://www.microwaves101.com/encyclopedia/baluns.cfm, updated Nov. 28, 2006 and downloaded Aug. 1, 2007.

H.T. Kim et al, "Ultra-wideband uniplaner MMIC balun using field transformations," Electronics Letters vol. 2 No. 6, Mar. 16, 2006.

(Continued)

*Primary Examiner*—Dean O Takaoka
(74) *Attorney, Agent, or Firm*—Kolisch Hartwell, PC

(57) ABSTRACT

A balun may include series-coupled balanced-signal lines. In some examples, a balun may include a first transmission line having a first unbalanced signal port on which an unbalanced signal may exist relative to circuit ground; a second transmission line having a first balanced-signal port may be connected in series with a third transmission line having a second balanced-signal port. In some examples, a fourth transmission line may be coupled to the first transmission line and have a third balanced-signal port. A fifth transmission line may be connected in series with the fourth transmission line and have a fourth balanced-signal port. In some examples, the transmission lines may be coaxial. Balanced signals may exist between the first and second balanced-signal ports and between the third and fourth balanced-signal ports. Series-connected coaxial transmission lines may be formed of a single coaxial line with a gap in the outer conductor separating the two coaxial transmission lines.

17 Claims, 4 Drawing Sheets

OTHER PUBLICATIONS

Nai-Shuo Cheng et al, "A 120-W X-Band Spatially Combined Solid-State Amplifier," IEEE Transactions on Microwave Theory and Techniques vol. 47 No. 12 pp. 2557 through 2561, Dec. 1999.

Angelos Alexanian, doctoral dissertation, "Planar and Distributed Spatial Power Combiners," University of California Santa Barbara, Jun. 1997.

Hongming An, et al, "A 50:1 Bandwidth Cost-Effective Coupler with Sliced Coaxial Cable," IEEE MTT-S Digest, 1996.

Paul Horowitz et al., "Stubs, baluns, and transformers," The Art of Electronics section 13.10, pp. 881 through 882, Second Edition Copyright 1989 Cambridge University Press.

Valerie Illingworth, editor, definition of the word "balun," The Penguin Dictionary of Electronics p. 30, Second Edition Copyright 1988 Penguin Books.

Kenneth J. Russell, "Microwave Power Combining Techniques," IEEE Transactions on Microwave Theory and Techniques vol. MTT-27 No. 5 pp. 472 through 478, May 1979.

C.W. Gerst, "Electrically Short 90° Couplers Utilizing Lumped Capacitors," Microwave Symposium Digest, G-MTT International vol. 67, Issue 1, pp. 58 through 62, May 1967.

G.D. Monteath, "Coupled Transmission Lines as Symmetrical Directional Couplers," Proc. IEE, Vol. 102, Part B, No. 3, pp. 383 through 392, May 1955.

* cited by examiner

BALUN WITH SERIES-CONNECTED BALANCED-SIGNAL LINES

BACKGROUND

For certain applications, there is a need for a broadband, high power communication system. For example, in military applications a broad bandwidth is required for secure spread spectrum communication and high power is required for long range. High power broadband communication systems require high power broadband antennas. Often these antennas have an input impedance that does not match the desired transmitter or receiver with which it is used. In such circumstances, baluns can be used to transform the impedance of the antenna to the impedance of the transmitter or receiver, or to convert between an unbalanced signal and a balanced signal. When large bandwidths are desired, coaxial baluns are often used.

Simple signal sources have 2 terminals, a source terminal and a return terminal, where most commonly a ground plane is used for the return path. The ground plane return simplifies circuit wiring, as a single conductor and the ground plane below form a complete signal path. The voltage on the ground plane is then the reference for this signal. Often this is referred to as an "unbalanced circuit", or "single ended circuit". In such "unbalanced circuits" when wires cross or run parallel with one another, there can be undesired coupling.

One method for reducing such coupling is to use 2 wires, one the signal, the other its return path, and no ground plane return path. In ac signals, either wire can be considered to be the signal, and the other the return. To minimize coupling to other circuits, it is highly desired that the signal current flowing in the two wires be exactly the same, and 180 degrees out of phase. That is, all of the return current for one wire of the pair is carried by the other wire, and the circuit is balanced. This guarantees that no return current is carried by the ground plane. In practice, such perfectly balanced, or differential, currents are only a theoretical goal.

An amplifier that uses balanced or differential input and output connections is less likely to have oscillations caused by input and output signals coupling, and less extraneous noise introduced by the surrounding circuitry. For this reason, practically all high gain operational amplifiers are differential. A "balun" is a component that converts an unbalanced source to a balanced one, and vice versa. Sometimes a balun is made with nearly complete isolation between the balanced terminals and ground. Sometimes a balun is made with each balanced terminal referenced to ground, but with equal and opposite voltages appearing at these terminals. These are both valid baluns, but in one case, the unbalanced voltage encounters high impedance to ground, making unbalanced current flow difficult, while in the other, any unbalanced current encounters a short circuit to ground, minimizing the voltage that enters the balanced circuit. Microwave baluns can be either of these types, or even a mixture of the two. In any case, one could connect 2 equal unbalanced loads to the 2 balanced terminals, with their ground terminals connected together to ground. Ideally, the unbalanced signal input to the balun would be equally distributed to the 2 unbalanced loads. Thus, a balun could be used as a power divider or combiner, where the 2 unbalanced loads or sources connected to the balanced terminals would be operating 180 degrees out of phase.

At microwave frequencies, it is very difficult to fabricate well balanced circuits, as small parasitic elements can unbalance the signals. A well balanced power divider or combiner that operates over a wide microwave bandwidth is thus a very important component, and one that supplies differential, 180 degree out of phase outputs is most desirable because of its independence from currents flowing in the ground plane.

SUMMARY

In some examples, a balun may include series-coupled balanced-signal lines, such as a balun including multiple coupled transmission lines. In some examples, a balun may include a first transmission line having a first conductor with a first end forming a first unbalanced signal port; a second transmission line having a second conductor inductively coupled to the first conductor, the second conductor having a first end forming a first balanced signal port; and a third transmission line electrically spaced from the second transmission line and having a third conductor connected in series with the second conductor, the third conductor having a first end forming a second balanced-signal port. A balanced signal may exist between the first and second balanced-signal ports.

In some examples, the first transmission line may further include a fourth conductor inductively coupled to the first conductor and to the second conductor. The third conductor may have a second end connected to a second end of the third conductor. In some examples the third transmission line may include a fifth conductor inductively coupled to the third conductor.

In some examples, the transmission lines may be coaxial lines with the outer conductor of the coaxial first transmission line connected along a length to the outer conductor of the coaxial second transmission line. The second and third coaxial transmission lines may be formed of a single coaxial line with a gap in the outer conductor separating the two coaxial transmission lines.

In some examples, a second end of the center or first conductor of the coaxial first transmission line is connected to the outer conductor of the third coaxial transmission line.

In some examples, a balun may further include fourth and fifth transmission lines. The fourth transmission line may have a sixth conductor and a seventh conductor, with the sixth conductor having a first end connected to a second end of the first conductor, and the seventh conductor inductively coupled to the sixth conductor and having a first end proximate the first end of the sixth conductor and a second end forming a third balanced-signal port. The fifth transmission line may have an eighth conductor and a ninth conductor, the eighth conductor having a first end connected to a first end of the fifth conductor, the ninth conductor having a first end proximate the first end of the eighth conductor and connected to the first end of the of the seventh conductor, and the ninth conductor being inductively coupled to the eighth conductor and having a second end forming a fourth balanced-signal port. A balanced signal may exist between the third and fourth balanced-signal ports.

In some examples, the fourth and fifth transmission lines are coaxial transmission lines. The fourth coaxial line may have a fourth center conductor and a fourth outer conductor. A first end of the fourth center conductor may form the third balanced signal port, a second end of the fourth outer conductor may be connected to a second end of the first center conductor, and the fourth outer conductor may be connected to circuit ground at a connection position spaced from the first end of the fourth outer conductor.

The fifth coaxial line may have a fifth center conductor and a fifth outer conductor. A first end of the fifth center conductor may form the fourth balanced-signal port. A second end of the fifth center conductor may be connected to a second end of the fourth center conductor. A first end of the fifth outer conductor may be proximate to and electrically spaced from a second end of the fourth outer conductor and connected to the first end of the third outer conductor.

DETAILED DESCRIPTION

A balun may include an input or unbalanced-signal port, on which an unbalanced signal is transmitted relative to a circuit ground, and two or more output or balanced-signal ports, on which balanced signals are transmitted between pairs of balanced-signal ports. Those skilled in the art will appreciate that the baluns may include transmission lines with lengths appropriate for a required operational frequency or frequency range. The transmission lines may be of any suitable form, such as a slotline, strip line, coplanar waveguide, microstrip, three-dimensional waveguide, or coaxial line. In the following examples baluns with coaxial transmission lines are shown. Other forms of transmission lines may also be used.

Figure 1:
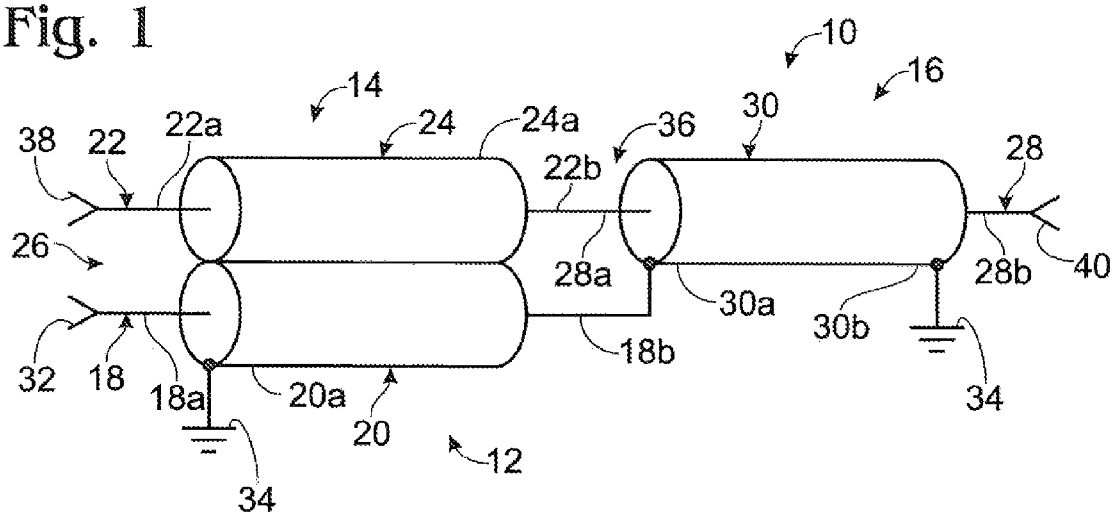
FIG. 1 is a general schematic of a two-way coax balun.

As mentioned, in some examples, a balun may include series-coupled balanced-signal lines. A first example of such a balun 10 is illustrated in FIG. 1. Balun 10 includes a first transmission line 12, a second transmission line 14, and a third transmission line 16.

Transmission line 12 may include a first conductor 18 and a second conductor 20. Transmission line 12 may be a coaxial transmission line, in which case conductor 18 may be a first center or inner conductor, and conductor 20 may be a first outer or shield conductor. Conductor 20 may be inductively coupled to conductor 18.

Transmission line 14 may include a third conductor 22 and a fourth conductor 24. Transmission line 14 may be a coaxial transmission line, in which case conductor 22 may be a second center conductor, and conductor 24 may be a second outer or shield conductor. Conductor 24 may be inductively coupled to conductor 22, and may be connected along a given length to conductor 20. For example, conductors 20 and 24 may be connected along a length that corresponds to a quarter wavelength of a center frequency of operation of balun 10. In some examples, conductors 20 and 24 may be part of a single combined conductor 26.

Transmission line 16 may include a fifth conductor 28 and a sixth conductor 30. Transmission line 16 may be a coaxial transmission line, in which case conductor 28 may be a third center conductor, and conductor 30 may be a third outer or shield conductor. Conductor 30 may be inductively coupled to conductor 28.

In this example, a first end 18*a* of conductor 18 forms an unbalanced-signal port 32, conducting an unbalanced signal relative to a circuit ground 34 connected to a corresponding end 20*a* of conductor 20. A second end 18*b* of conductor 18 may be connected to a first end 30*a* of conductor 30. First end 30*a* of conductor 30 may be proximate to a first end 24*a* of conductor 24, with there being a gap 36 between conductor ends 24*a* and 30*a*. A first end 22*a* of conductor 22 may be a first balanced-signal port 38. A second end 22*b* of conductor 22 may be connected to a first end 28*a* of conductor 28, such as at gap 36. A second end 28*b* of conductor 28 may form a second balanced-signal port 40, and a second end 30*b* of conductor 30 may be connected to circuit ground 34.

Depending on the application, balun 10 may transform a balanced signal existing between the balanced-signal ports into an unbalanced signal on the unbalanced-signal port, in which case the balanced signal ports are the inputs, or balun 10 may transform an unbalanced signal into a pair of balanced signals, in which case the unbalanced-signal port is the input. Balun 10 also may provide an impedance transformation in a circuit. More specifically, a signal input on the unbalanced signal port 32 of transmission line 12 may be at a first impedance and a signal output on the balanced-signal ports 38 and 40 of respective transmission lines 14 and 16 may be at a second impedance. For example, if transmission line 12 has a characteristic impedance of 50 ohms and transmission lines 14 and 16 each has a characteristic impedance of 25 ohms, then there will be a 2:1 impedance transformation. Further, the balun acts as a 2-way signal combiner/divider in the sense that the signal transmitted by transmission line 12 may be shared by transmission lines 14 and 16.

It is also seen that transmission line 14 is connected in series with transmission line 16. This series impedance transformation results in a low voltage standing wave ratio and low insertion loss over a broad frequency range at the input port 32. The only frequency limitation is caused by the current to ground flowing along the outside of transmission line 12.

Figure 2:
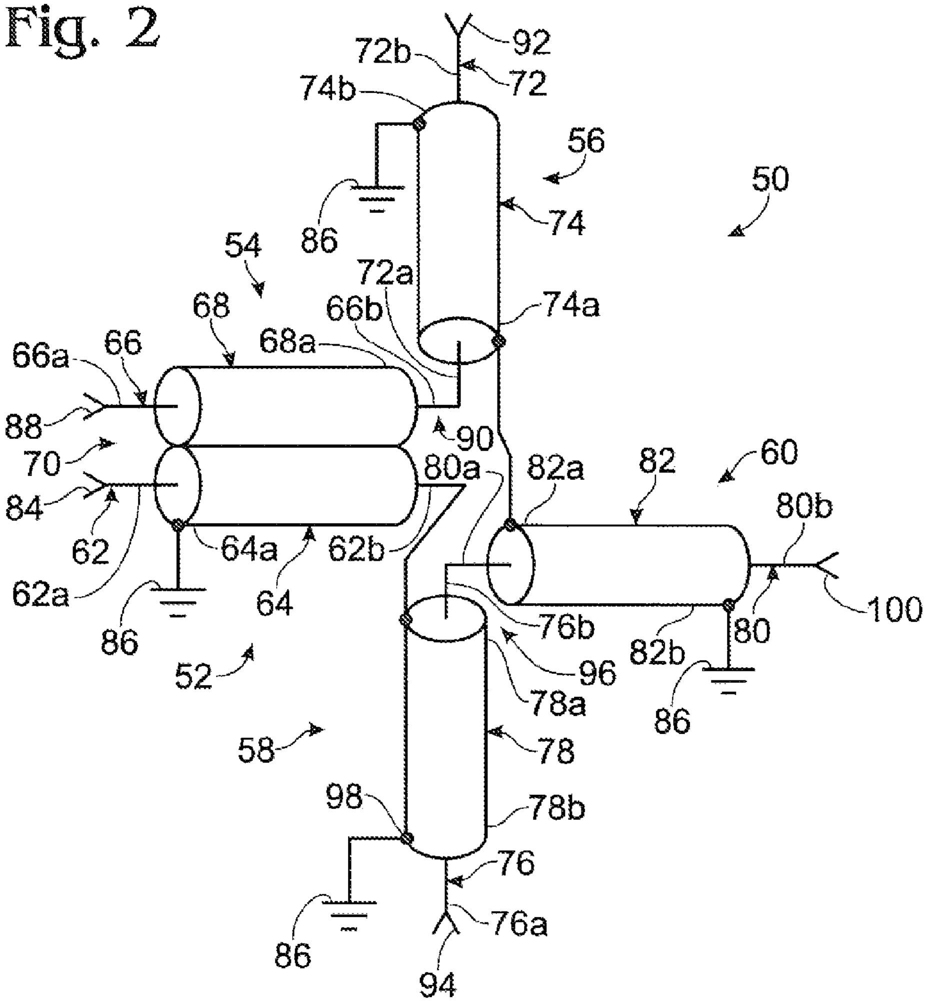
FIG. 2 is a general schematic of a four-way coax balun.

A variation of balun 10 is shown as a 4-way balun 50 in FIG. 2. Similar to balun 10, balun 50 includes a plurality of transmission lines, including in this example a first transmission line 52, a second transmission line 54, a third transmission line 56, a fourth transmission line 58, and a fifth transmission line 60.

Transmission line 52 may include a first conductor 62 and a second conductor 64. Transmission line 52 may be a coaxial transmission line, in which case conductor 62 may be a first center or inner conductor, and conductor 64 may be a first outer or shield conductor. Conductor 64 may be inductively coupled to conductor 62.

Transmission line 54 may include a third conductor 66 and a fourth conductor 68. Transmission line 54 may be a coaxial transmission line, in which case conductor 66 may be a second center conductor, and conductor 68 may be a second outer or shield conductor. Conductor 68 may be inductively coupled to conductor 66, and may be connected along a given length to conductor 64. For example, conductors 64 and 68 may be connected along a length that corresponds to a quarter wavelength of a center frequency of operation of balun 50. In some examples, conductors 64 and 68 may be part of a single combined conductor 70.

Transmission line 56 may include a fifth conductor 72 and a sixth conductor 74. Transmission line 56 may be a coaxial transmission line, in which case conductor 72 may be a third center conductor, and conductor 74 may be a third outer or shield conductor. Conductor 74 may be inductively coupled to conductor 72.

Transmission line 58 may include a seventh conductor 76 and an eighth conductor 78. Transmission line 12 may be a coaxial transmission line, in which case conductor 76 may be a fourth center conductor, and conductor 78 may be a fourth outer or shield conductor. Conductor 78 may be inductively coupled to conductor 76.

Transmission line 60 may include a ninth conductor 80 and a tenth conductor 82. Transmission line 60 may be a coaxial transmission line, in which case conductor 80 may be a fifth center conductor, and conductor 82 may be a fifth outer or shield conductor. Conductor 82 may be inductively coupled to conductor 80.

In this example, a first end 62*a* of conductor 62 forms an unbalanced-signal port 84 relative to a circuit ground 86 connected to a corresponding end 64*a* of conductor 64. A second end 62*b* of conductor 62 may be connected to a first end 78*a* of conductor 78.

A first end 66*a* of conductor 66 may be a first balanced-signal port 88. A second end 66*b* of conductor 66 may be connected to a first end 72*a* of conductor 72, such as at a gap 90 between a first end 68*a* of conductor 68 and a first end 74*a* of conductor 74. First end 74*a* of conductor 74 may be proximate or next to first end 68*a* of conductor 68. A second end 72*b* of conductor 72 may form a second balanced-signal port 92, and an associated end 74*b* may be connected to circuit ground 86. First conductor end 74*a* may also be connected to a first end 82*a* of conductor 82.

A first end 76*a* of conductor 76 may be a third balanced-signal port 94. Conductor end 78*a* may be proximate to conductor end 82*a*, being separated by a gap 96. A second end 78*b* of conductor 78 may be coupled to circuit ground 86 at a position 98 on the conductor spaced from end 78*a*. For example, position 98 may be spaced a quarter wavelength from the point of connection of conductor 62 to conductor 78. A second end 76*b* of conductor 76 may be connected to a first end 80*a* of conductor 80, as at gap 96. A second end 80*b* of conductor 80 may be a fourth balanced signal port 100, and an associated end 82*b* may be connected to circuit ground 86.

Depending on the application, balun 50 may transform two balanced signals or 4 unbalanced signals into a single unbalanced signal, or transform a single unbalanced signal into two balanced or four unbalanced signals. The single unbalanced signal exists on the unbalanced-signal port, and unbalanced signals may exist between each balanced-signal port and circuit ground. Further, the balun acts as a 4-way signal combiner/divider in the sense that the signal transmitted by transmission line 52 may be shared by transmission lines 54, 56, 58 and 60.

Additionally, balun 50 may provide an impedance transformation in a circuit. More specifically, a signal input on the unbalanced-signal port 84 of transmission line 52 may be at a first impedance and a signal output on the balanced-signal ports 88, 92, 94 and 100 of respective transmission lines 54, 56, 58 and 60 may be at a second impedance. For example, if transmission line 52 has a characteristic impedance of 50 ohms and transmission lines 54, 56, 58 and 60 each has a characteristic impedance of about 12.5 ohms, then there will be a 4:1 impedance transformation.

In balun 50, transmission line 54 is connected in series with transmission line 56, and transmission line 58 is connected in series with transmission line 60. This corresponds with conductors 66 and 76 being inductively coupled to an unbalanced-signal-conductor 62, and conductors 72 and 80 being respectively connected to conductors 66 and 76. Similar to balun 10, balun 50 has a low voltage standing wave ratio and low insertion loss over a broad frequency range.

Figure 3:
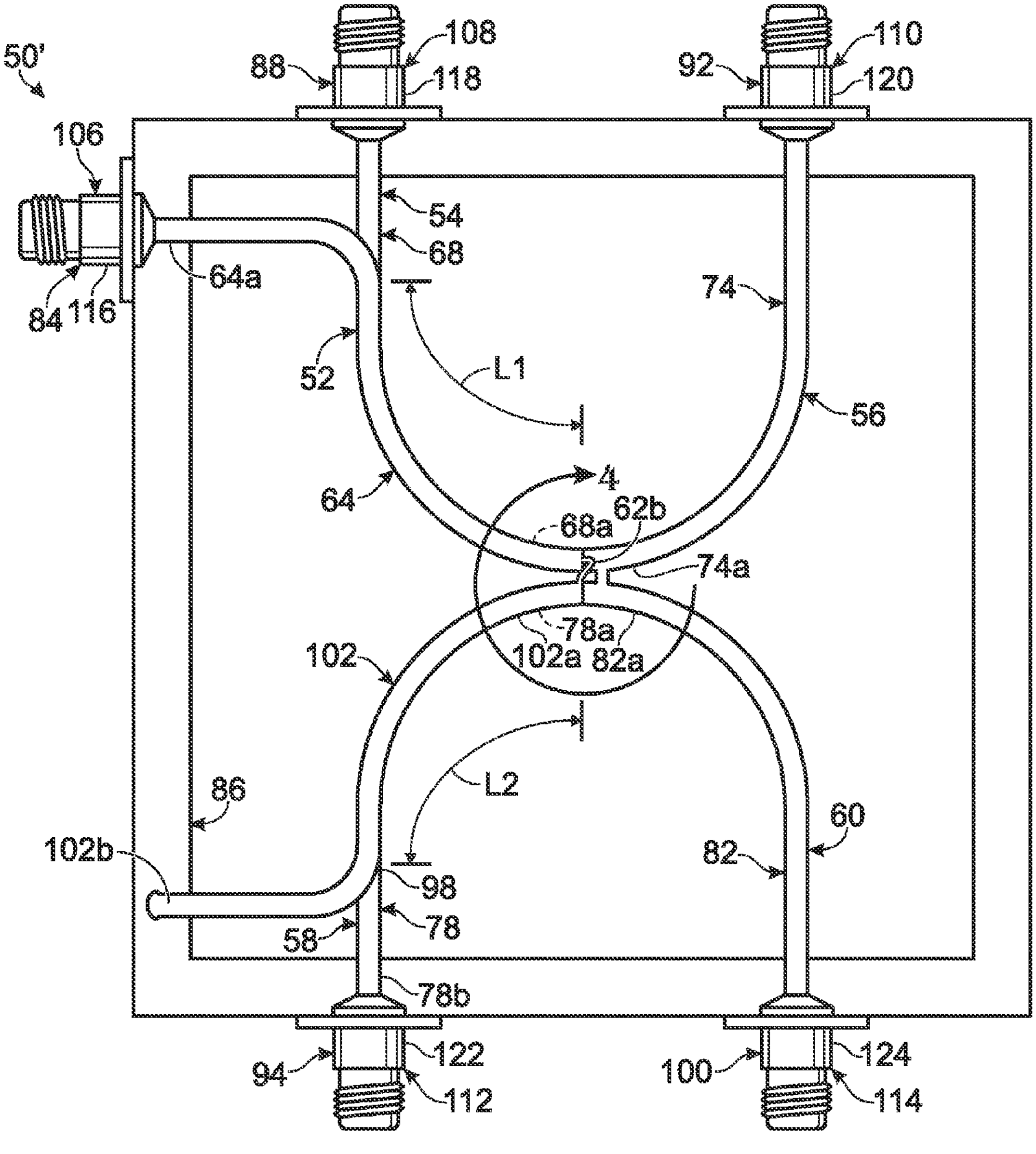
FIG. 3 is a plan view of an example of the four-way coax balun of FIG. 2.
Figure 4:
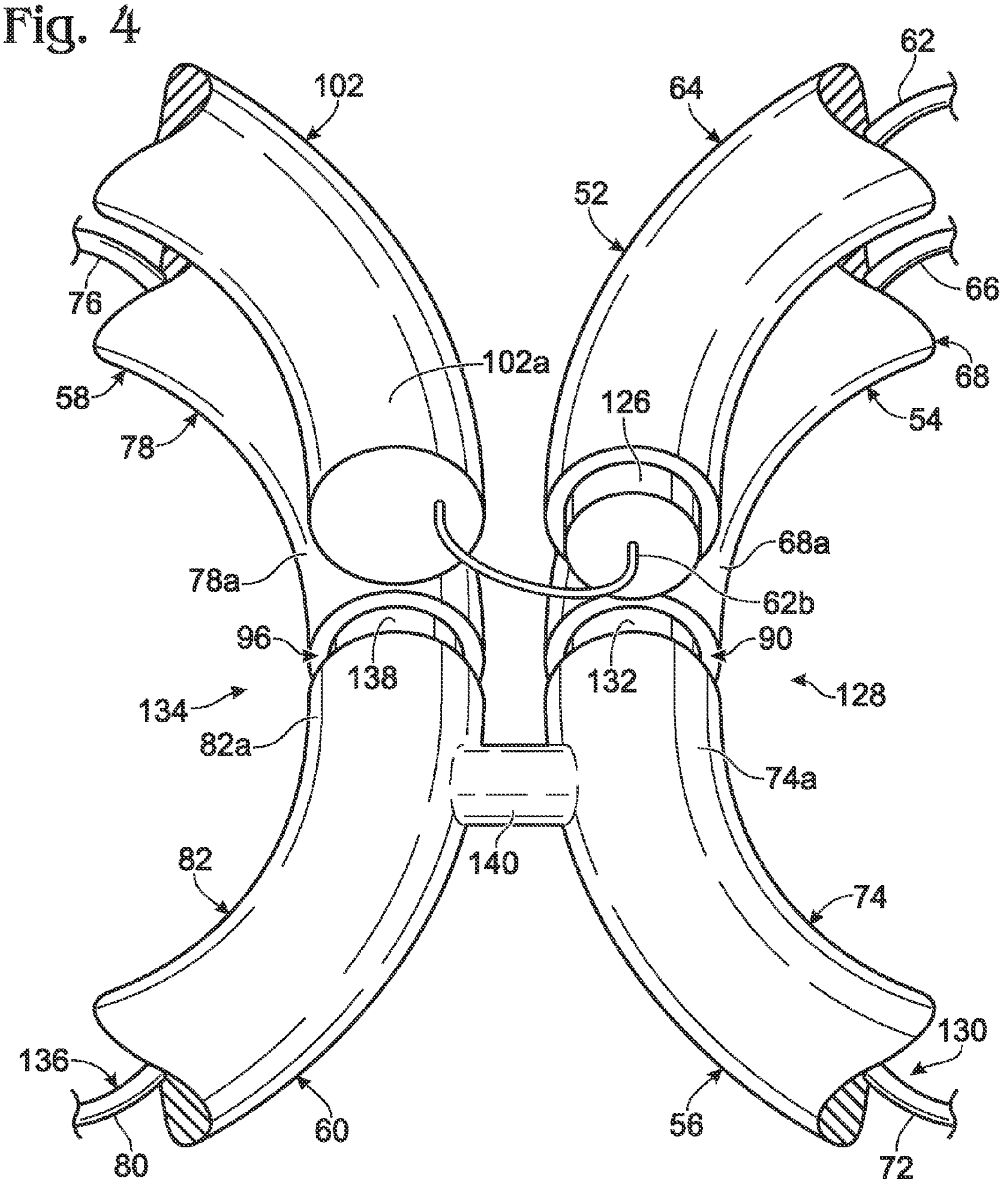
FIG. 4 is an enlarged perspective view of a portion of the balun of FIG. 3 represented by line 4 of FIG. 3.

A physical embodiment of balun 50 was constructed as balun 50' and tested. A plan view of balun 50' is shown in FIG. 3, and an enlarged perspective view of the center portion of balun 50' identified by line 4 is shown in FIG. 4. Corresponding parts have the same reference numbers as balun 50 shown in FIG. 2. It is seen that coaxial transmission line 52 is mounted directly onto coaxial transmission line 54. More specifically, first outer conductor 64 is directly connected along a length L1 to second outer conductor 68. Length L1 is the distance over which a signal on first inner conductor 62 is inductively coupled to second inner conductor 66. Length L1 may have a value determined by the application in which the balun is used, and may for example, have a value that corresponds to or is about equal to a quarter of the wavelength of a given frequency related to a frequency bandwidth over which the balun is intended to operate, such as a center frequency of a design bandwidth.

Similarly, a connecting conductor 102 is disposed on fourth outer conductor 78 of fourth coaxial transmission line 58. In this example, conductor 102 has an outer diameter corresponding to or about the same as the outer diameter of conductor 78 of transmission line 58. Conductor 102 may be a solid wire, as shown, a conductive tube, or an outer shield of a coaxial transmission line in which the center and outer conductors are shorted. As shown in FIG. 2, the outer conductor 78 of transmission line 58 may be used instead of conductor 102, in which case, conductor 78 may be larger to provide equivalent electrical performance. Other conductor configurations may also be used that provide suitable performance.

In this example, center conductor end 62*b* of transmission line 52 is connected to an end 102*a* of connecting conductor 102 proximate to end 62*b*. Connecting conductor 102 extends from end 102*a* to a distal end 102*b* electrically connected to circuit ground 86. The circuit ground is shown extending around the perimeter of a dielectric support or mounting board 104. Other support and support configurations may be used, as appropriate. For example, ground 86 could extend along a back-side surface of the board with connections to the ground provided by vias or through-holes extending through the board. Conductor 102 diverts from outer conductor 78 of transmission line 58 at position 98 disposed a distance or length L2 from end 78*a*. Length L2 may have a value determined by the application in which the balun is used, and may for example, have a value that corresponds to or is about equal to a quarter of the wavelength of a design frequency related to a frequency bandwidth over which the balun is intended to operate, such as a center frequency. Lengths L1 and L2 may be different lengths in some applications, and may be about the same length in other applications. In the example shown, length L1 substantially equals length L2.

In the embodiment shown in FIG. 3, unbalanced-signal port 84 is provided by a coaxial connector 106. Similarly, balanced-signal ports 88, 92, 94 and 100 are provided by coaxial connectors 108, 110, 112 and 114. These connectors have respective outer conductors 116, 118, 120, 122 and 124 that are connected to circuit ground 86, as well as to respective outer conductors 64, 68, 74, 78 and 82 of transmission lines 52, 54, 56, 58 and 60.

As shown in FIG. 4, each coaxial transmission line in balun 50' includes a center conductor supported in and separated from a circumferential shielding outer conductor by an intervening dielectric. More specifically, center conductor 62 may be supported in spaced relation from outer conductor 64 of transmission line 52 by a suitable dielectric 126. Transmission lines 54 and 56 may be made of a single coaxial line 128 having gap 90 separating the outer conductor into electrically spaced-apart outer conductors 68 and 74. Inner conductors 66 and 72 form a continuous center conductor 130 that extends through gap 90. Coaxial line 128, and therefore also coaxial lines 54 and 56 collectively, has a continuous dielectric 132, also extending through gap 90, that supports center conductor 130.

Similarly, transmission lines 58 and 60 may be made of a single coaxial line 134 having gap 96 separating the outer conductor into electrically spaced-apart outer conductors 78 and 82. Inner conductors 76 and 80 form a continuous center conductor 136 that extends through gap 90. Coaxial line 128, and therefore also coaxial lines 54 and 56 collectively, has a continuous dielectric 138, also extending through gap 96, that supports center conductor 136.

End 74*a* of conductor 74 is electrically and physically connected to end 82*a* of conductor 82 by a connecting conductor 140. Optionally, conductor ends 74*a* and 82*a* may be positioned close enough together that there is direct connection between them. However, in this example outer conductor 64 of transmission line 52 and outer conductor 68 of transmission line 54 are both electrically and physically spaced from connecting conductor 102 as well as from outer conductor 78 of transmission line 78.

It will be appreciated that variations may be made in the structure and general configurations disclosed for balun 10 and/or balun 50 (including balun 50'). For example, as has been mentioned, these baluns may be realized by using other forms of transmission lines. Connecting conductor 102 may be omitted, in which case conductor 62 may be connected directly to conductor 78, as is illustrated in FIG. 2. In such a case, the configuration of conductor 78 may be modified to provide a desired or equivalent electrical function. Gaps 90 and 96 each may be replaced with a transmission line having a length that is an integral number of half-wavelengths at a design frequency. Transmission lines having a length equal to a quarter wavelength may correspondingly have lengths that are an odd integral number of quarter wavelengths. Conductors that form a U-shape may be straight or have other regular or irregular configurations. Compensating capacitors or other lump or distributed elements may be added, or existing conductors may be reconfigured to vary the effective impedances.

Figure 5:
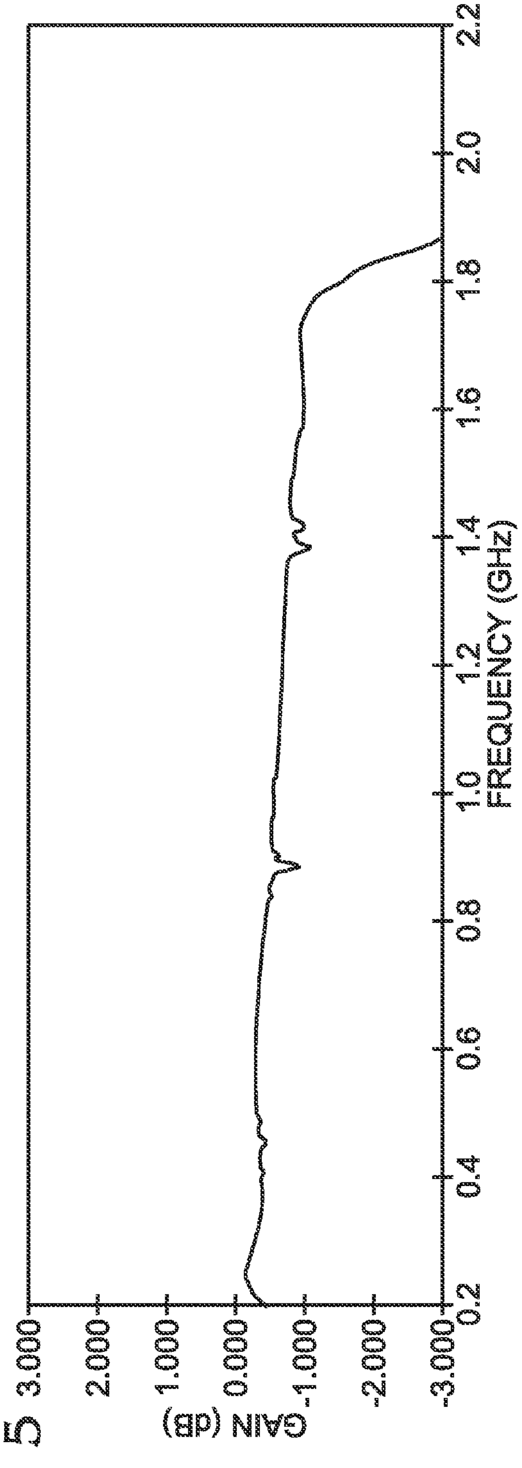
FIG. 5 is a graph showing gain versus frequency of an embodiment of the 1-to-4 balun of FIG. 3 with an input capacitor and when connected to an identical 4-to-1 balun in reverse configuration and enclosed in an electromagnetic shield for test purposes.
Figure 6:
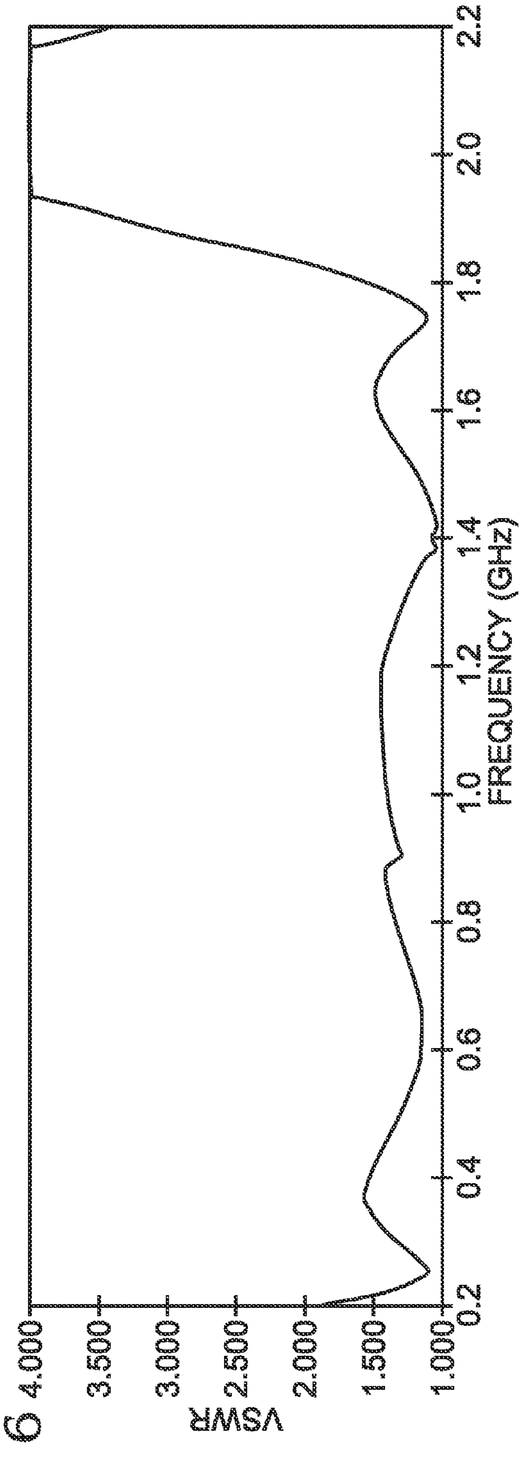
FIG. 6 is a graph showing voltage standing-wave ratio (VSWR) for the same embodiment of the balun as in FIG. 5.

In order to test balun 50' conveniently, a duplicate balun was made and the corresponding balanced signal lines connected together with a length of coaxial cable having the same impedance. A 0.5 pf capacitor was placed at the unbalanced-signal port of each balun to compensate for inductance in the structure. FIG. 5 shows the gain of this compound assembly. It is seen to be less than about 0.5 dB for the assembly, or less than about 0.25 dB per balun over the frequency range of about 200 MHz to about 1.8 GHz. The roll-off at the high-frequency end is due primarily to the capacitors on the inputs. FIG. 6 shows the input voltage standing wave ratio (VSWR) for the assembly. It is seen to be generally less than 1.5 over the same frequency range, which should be representative of the VSWR for each balun.

Based on the foregoing description, it is seen that a balun may comprise a circuit ground; a first transmission line including a first conductor having a first end forming a first unbalanced-signal port relative to the circuit ground, and a second conductor inductively coupled to the first conductor; a second transmission line including a third conductor inductively coupled to the second conductor and having a first end forming a first balanced-signal port; and a third transmission line including a fourth conductor having a first end connected to a second end of the third conductor and a second end forming a second balanced-signal port.

The third transmission line may include a fifth conductor inductively coupled to the fourth conductor and have a first end proximate the first end of the fourth conductor, and the first conductor may have a second end connected to the first end of the fifth conductor.

The balun may further comprise a fourth transmission line having a sixth conductor and a seventh conductor, the sixth conductor having a first end connected to a second end of the first conductor, and the seventh conductor inductively coupled to the sixth conductor and having a first end proximate the first end of the sixth conductor and a second end forming a third balanced-signal port; and a fifth transmission line having an eighth conductor and a ninth conductor, the eighth conductor having a first end connected to a first end of the fifth conductor, and the ninth conductor having a first end proximate the first end of the eighth conductor and connected to the first end of the seventh conductor, and the ninth conductor being inductively coupled to the eighth conductor and having a second end forming a fourth balanced-signal port.

A balun may have first, second and third transmission lines that are coaxial lines, wherein the first conductor is a first center conductor of the first coaxial line, the second conductor is a first outer conductor of the first coaxial line as well as a second outer conductor of the second coaxial line, the third conductor is a second center conductor of the second coaxial line, the fourth conductor is a third center conductor of the third coaxial line, and the third coaxial line includes a third outer conductor. Such a balun may further comprise a fourth coaxial line having a fourth center conductor and a fourth outer conductor, a first end of the fourth center conductor forming a third balanced-signal port, a first end of the fourth outer conductor being connected to a second end of the first center conductor, and the fourth outer conductor being connected to the circuit ground at a connection position spaced from the first end of the fourth outer conductor; and a fifth coaxial line having a fifth center conductor and a fifth outer conductor, a first end of the fifth center conductor forming a fourth balanced-signal port, a second end of the fifth center conductor being connected to a second end of the fourth center conductor, and a first end of the fifth outer conductor being proximate to and electrically spaced from a second end of the fourth outer conductor and connected to the first end of the third outer conductor. Such a balun may yet further comprise a connecting conductor connecting the circuit ground with the fourth outer conductor at the connection position. In some examples, the connecting conductor further is connected to the fourth outer conductor along a length extending between the first end of the fourth outer conductor and the connection position of the fourth outer conductor.

In these or other examples, a first coaxial line may have an impedance that is about two times an impedance of each of second, third, fourth and fifth coaxial lines.

Optionally, in a balun as indicated above having five coaxial conductors, an end of a second outer conductor and an end of the third outer conductor may be disposed proximate an end of a fourth outer conductor and an end of a fifth outer conductor.

In some examples, a balun may include second and third coaxial lines as described above that form a U-shape. Similarly, such a balun may include fourth and fifth coaxial lines that form, in combination, a U-shape that is a mirror-image of the U-shape of the second and third coaxial lines.

In some examples, second and third coaxial lines are formed from a single coaxial line with a gap in an outer conductor of the single coaxial line separating the second outer conductor from the third outer conductor.

In some examples of baluns having three coaxial lines, a second end of a first center conductor of a first coaxial line is connected to a first end of a third outer conductor of a third coaxial line.

In some examples, a balun may include second and third coaxial lines that are formed from a single coaxial line with a gap in an outer conductor of the single coaxial line separating the second outer conductor from the third outer conductor. A four-way coaxial balun, then, may comprise a first coaxial line having a first impedance, a first center conductor and a first outer conductor, a first end of the first center conductor forming an unbalanced-signal port; a second coaxial line having a second impedance about one-half the first impedance, a second center conductor and a second outer conductor, a first end of the second center conductor forming a first balanced-signal port, and the second outer conductor being connected along a length to the first outer conductor; a third coaxial line having substantially the second impedance, a third center conductor and a third outer conductor, a first end of the third center conductor forming a second balanced-signal port, a second end of the third center conductor being connected to a second end of the second center conductor, and a first end of the third outer conductor being proximate to and electrically spaced from a first end of the second outer conductor; a fourth coaxial line having substantially the second impedance, a fourth center conductor and a fourth outer conductor, a first end of the fourth center conductor forming a third balanced-signal port, and the fourth outer conductor being connected to circuit ground at a connection position spaced from a first end of the fourth outer conductor; a fifth coaxial line having substantially the second impedance, a fifth center conductor and a fifth outer conductor, a first end of the fifth center conductor forming a fourth balanced-signal port, a second end of the fifth center conductor being connected to a second end of the fourth center conductor, and a first end of the fifth outer conductor being proximate to and electrically spaced from a second end of the fourth outer conductor and connected to the first end of the third outer conductor; and a connecting conductor having an outer dimension with a size corresponding to the size of the first outer conductor, a second end of the first center conductor being connected to a first end of the connecting conductor, the connecting conductor being connected to the fourth outer conductor along a length extending between the first end of the fourth outer conductor and the connection position of the fourth outer conductor, and connecting the circuit ground with the fourth outer conductor at the connection position.

In some examples of such a balun, the second end of the second outer conductor and the first end of the third outer conductor are disposed proximate the second end of the fourth outer conductor and the first end of the fifth outer conductor. Alternatively or in addition, the second and third coaxial lines may form in combination a U-shape. Similarly, the fourth and fifth coaxial lines may form, in combination, a U-shape that is a mirror-image of the U-shape of the second and third coaxial lines.

In some examples, the second and third coaxial lines, and/or the fourth and fifth coaxial lines may be formed from a single coaxial line with a gap in an outer conductor of the single coaxial line separating the second outer conductor from the third outer conductor.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled. Accordingly, while embodiments of baluns and methods of transforming balanced and unbalanced signals or impedances have been particularly shown and described, as has been mentioned, many variations may be made therein. Further, this disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. Accordingly, no single feature or element, or combination thereof, is essential to all possible combinations that may be claimed in this or a later application. Each claim defines an invention disclosed in the foregoing disclosure, but any one claim does not necessarily encompass all features or combinations that may be claimed.

Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

INDUSTRIAL APPLICABILITY

The methods and apparatus described in the present disclosure are applicable to circuits using alternating currents, and in particular to such circuits operating at radio and higher frequencies, such as circuits used in telecommunications and other industries having systems with high-frequency devices.

The invention claimed is:

1. A balun comprising:

a circuit ground;

a first transmission line including a first conductor having a first end forming a first unbalanced-signal port relative to the circuit ground, and a second conductor inductively coupled to the first conductor;

a second transmission line including a third conductor inductively coupled to the second conductor and having a first end forming a first balanced-signal port;

a third transmission line electrically spaced from the second transmission line and including a fourth conductor having a first end connected to a second end of the third conductor and a second end forming a second balanced-signal port, and a fifth conductor inductively coupled to the fourth conductor;

a fourth transmission line having a sixth conductor and a seventh conductor, the sixth conductor having a first end connected to a second end of the first conductor, and the seventh conductor inductively coupled to the sixth conductor and having a first end proximate the first end of the sixth conductor and a second end forming a third balanced-signal port; and a fifth transmission line having an eighth conductor and a ninth conductor, the eighth conductor having a first end connected to a first end of the fifth conductor, and the ninth conductor having a first end proximate the first end of the eighth conductor and connected to the first end of the of the seventh conductor, and the ninth conductor being inductively coupled to the eighth conductor and having a second end forming a fourth balanced-signal port.

2. A balun comprising:

a circuit ground;

a first transmission line including a first conductor having a first end forming a first unbalanced-signal port relative to the circuit ground, and a second conductor inductively coupled to the first conductor;

a second transmission line including a third conductor inductively coupled to the second conductor and having a first end forming a first balanced-signal port; and a third transmission line electrically spaced from the second transmission line and including a fourth conductor having a first end connected to a second end of the third conductor and a second end forming a second balanced-signal port;

wherein the first, second and third transmission lines are coaxial lines, the first conductor is a first center conductor of the first coaxial line, the second conductor is a first outer conductor of the first coaxial line as well as a second outer conductor of the second coaxial line, the third conductor is a second center conductor of the second coaxial line, the fourth conductor is a third center conductor of the third coaxial line, and the third coaxial line includes a third outer conductor.

3. The balun of claim 2, further comprising:

a fourth coaxial line having a fourth center conductor and a fourth outer conductor, a first end of the fourth center conductor forming a third balanced-signal port, a first end of the fourth outer conductor being connected to a second end of the first center conductor, and the fourth outer conductor being connected to the circuit ground at a connection position spaced from the first end of the fourth outer conductor; and a fifth coaxial line having a fifth center conductor and a fifth outer conductor, a first end of the fifth center conductor forming a fourth balanced-signal port, a second end of the fifth center conductor being connected to a second end of the fourth center conductor, and a first end of the fifth outer conductor being proximate to and electrically spaced from the first end of the fourth outer conductor and connected to a first end of the third outer conductor.

4. The balun of claim 3, further comprising a connecting conductor connecting the circuit ground with the fourth outer conductor at the connection position.

5. The balun of claim 4, wherein the connecting conductor further is connected to the fourth outer conductor along a length extending between the first end of the fourth outer conductor and the connection position of the fourth outer conductor.

6. The balun of claim 3, wherein the first coaxial line has an impedance that is about four times an impedance of each of the second, third, fourth and fifth coaxial lines.

7. The balun of claim 3, wherein the second end of the second outer conductor and the first end of the third outer conductor are disposed proximate the second end of the fourth outer conductor and the first end of the fifth outer conductor.

8. The balun of claim 3, wherein the second and third coaxial lines form a U-shape.

9. The balun of claim 8, wherein the fourth and fifth coaxial lines form, in combination, a U-shape that is a mirror-image of the U-shape of the second and third coaxial lines.

10. The balun of claim 3, wherein the second and third coaxial lines are formed from a single coaxial line with a gap in an outer conductor of the single coaxial line separating the second outer conductor from the third outer conductor.

11. The balun of claim 2, wherein a second end of the first center conductor is connected to the first end of the third outer conductor.

12. The balun of claim 2, wherein the second and third coaxial lines are formed from a single coaxial line with a gap in an outer conductor of the single coaxial line separating the second outer conductor from the third outer conductor.

13. A four-way coaxial balun comprising:

a first coaxial line having a first impedance, a first center conductor and a first outer conductor, a first end of the first center conductor forming an unbalanced-signal port;

a second coaxial line having a second impedance about one-half one-fourth the first impedance, a second center conductor and a second outer conductor, a first end of the second center conductor forming a first balanced-signal port, and the second outer conductor being connected along a length to the first outer conductor; and a third coaxial line having substantially the second impedance, a third center conductor and a third outer conductor, a first end of the third center conductor forming a second balanced-signal port, a second end of the third center conductor being connected to a second end of the second center conductor, and a first end of the third outer conductor being proximate to and electrically spaced from a first end of the second outer conductor;

a fourth coaxial line having substantially the second impedance, a fourth center conductor and a fourth outer conductor, a first end of the fourth center conductor forming a third balanced-signal port, and the fourth outer conductor being connected to circuit ground at a connection position spaced from a first end of the fourth outer conductor;

a fifth coaxial line having substantially the second impedance, a fifth center conductor and a fifth outer conductor, a first end of the fifth center conductor forming a fourth balanced-signal port, a second end of the fifth center conductor being connected to a second end of the fourth center conductor, and a first end of the fifth outer conductor being proximate to and electrically spaced from the first end of the fourth outer conductor and connected to the first end of the third outer conductor; and a connecting conductor having an outer dimension with a size corresponding to the size of the first outer conductor, a second end of the first center conductor being connected to a first end of the connecting conductor, the connecting conductor being connected to the fourth outer conductor along a length extending between the first end of the fourth outer conductor and the connection position of the fourth outer conductor, and connecting the circuit ground with the fourth outer conductor at the connection position.

14. The balun of claim 13, wherein the second end of the second outer conductor and the first end of the third outer conductor are disposed proximate the second end of the fourth outer conductor and the first end of the fifth outer conductor.

15. The balun of claim 13, wherein the second and third coaxial lines form in combination a U-shape.

16. The balun of claim 15, wherein the fourth and fifth coaxial lines form, in combination, a U-shape that is a mirror-image of the U-shape of the second and third coaxial lines.

17. The balun of claim 13, wherein the second and third coaxial lines are formed from a single coaxial line with a gap in an outer conductor of the single coaxial line separating the second outer conductor from the third outer conductor.

* * * * *